US009491848B2

(12) United States Patent
Yamashita

(10) Patent No.: US 9,491,848 B2
(45) Date of Patent: Nov. 8, 2016

(54) GROUNDING PART, ELECTRONIC DEVICE, IMAGING DEVICE, AND GROUNDING PART PRODUCTION METHOD

(71) Applicant: Naoyuki Yamashita, Kanagawa (JP)

(72) Inventor: Naoyuki Yamashita, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 171 days.

(21) Appl. No.: 14/539,041

(22) Filed: Nov. 12, 2014

(65) Prior Publication Data

US 2015/0146392 A1    May 28, 2015

(30) Foreign Application Priority Data

Nov. 25, 2013  (JP) .................................. 2013-242698
May 9, 2014    (JP) .................................. 2014-097653

(51) Int. Cl.
  H05K 1/02      (2006.01)
  H04N 5/225     (2006.01)
  H05K 9/00      (2006.01)

(52) U.S. Cl.
  CPC .......... *H05K 1/0215* (2013.01); *H04N 5/2251* (2013.01); *H04N 5/2257* (2013.01); *H05K 1/0216* (2013.01); *H05K 9/0064* (2013.01)

(58) Field of Classification Search
  CPC ........................... H04N 5/2257; H05K 1/0215
  See application file for complete search history.

(56) References Cited

U.S. PATENT DOCUMENTS 7,357,645 B2 * 4/2008 Jeong ..................... H05K 7/142
                                                439/66
7,491,070 B2 * 2/2009 Chen .................. H01R 12/7047
                                                361/804

(Continued)

FOREIGN PATENT DOCUMENTS

JP      11-261858       9/1999
JP      2006-351210     12/2006

(Continued)

OTHER PUBLICATIONS

Apr. 15, 2015 European search report in corresponding European Patent Application No. 14 19 2890.

*Primary Examiner* — Adrian S Wilson
(74) *Attorney, Agent, or Firm* — Cooper & Dunham LLP

(57) ABSTRACT

A grounding part, an electronic device, an imaging device, and a method of producing a grounding part are provided. The grounding part includes a first connecting component made of an electrically conductive material and connected to a circuit board having an electronic component thereon, and a second connecting component made of an electrically conductive material and connected to the first connecting component and a grounding member. The first connecting component includes a substrate connecting part connected to the circuit board, and a second-connecting-component connecting part connected to the second connecting component, and the second connecting component includes a first-connecting-component connecting part connected to the first connecting component, and a grounding-part connecting part connected to the grounding member. The imaging device includes the circuit board and the grounding member. The method includes a method for producing the first connecting component and a method for producing the second connecting component.

20 Claims, 21 Drawing Sheets

(56) References Cited

U.S. PATENT DOCUMENTS

| | | | |
|---|---|---|---|
| 2001/0004347 A1* | 6/2001 | Koga | G11B 7/0925 369/116 |
| 2005/0079748 A1* | 4/2005 | Kim | H01R 4/66 439/92 |
| 2007/0077794 A1* | 4/2007 | Chen | H05K 1/0215 439/108 |
| 2009/0181563 A1* | 7/2009 | Lin | H01R 12/58 439/92 |
| 2011/0298925 A1 | 12/2011 | Inoue et al. | |
| 2013/0148217 A1 | 6/2013 | Yamashita | |
| 2013/0279143 A1 | 10/2013 | Wang | |

FOREIGN PATENT DOCUMENTS

| | | |
|---|---|---|
| JP | 2008-208852 | 9/2008 |
| JP | 2010-200008 | 9/2010 |
| JP | 2011-139305 | 7/2011 |
| JP | 2011-166012 | 8/2011 |

* cited by examiner

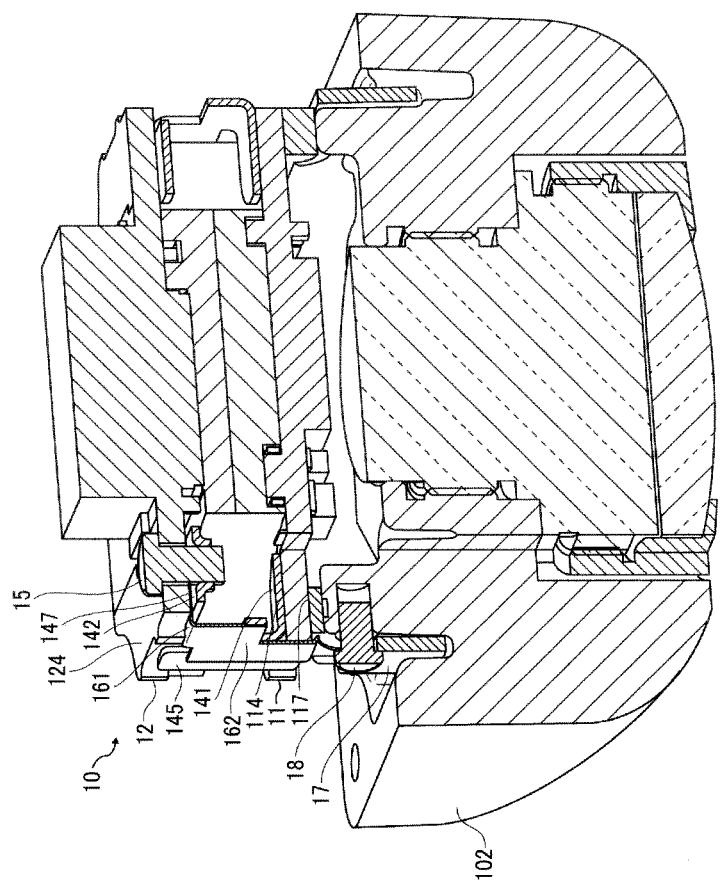

GROUNDING PART, ELECTRONIC DEVICE, IMAGING DEVICE, AND GROUNDING PART PRODUCTION METHOD

CROSS-REFERENCE TO RELATED APPLICATIONS

This patent application is based on and claims priority pursuant to 35 U.S.C. §119(a) to Japanese Patent Application Nos. 2013-242698 and 2014-097653, filed on Nov. 25, 2013, and May 9, 2014, respectively, in the Japan Patent Office, the entire disclosure of which is hereby incorporated by reference herein.

BACKGROUND

1. Technical Field

Example embodiments of the present invention generally relate to a grounding part, an electronic device, an imaging device, and a grounding part production method.

2. Background Art

In recent years, a vehicle-installed imaging device, which is an example of an electronic device, used for various purposes. For example, a vehicle-installed imaging device may serve as a drive recorder to store the images captured while a vehicle is travelling, or as an active safety system to support the driving by detecting or determining the positions of obstacles or other vehicles.

It is desired that such imaging devices achieve even higher resolution, mass data communication, and digitization in order to detect or determine positions of an object by using image recognition technology.

Such digitization makes it difficult to maintain electromagnetic compatibility (EMC) of imaging devices that indicates the electromagnetic non-interference or tolerance of the electronic devices.

Here, the term electromagnetic non-interference indicates a state in which a certain electronic device does not produce electromagnetic interference (EMI) whose level is equal to or greater than a certain level, which affects the operation of other electronic devices or human bodies.

The term electromagnetic tolerance indicates a state in which a certain electronic device has electromagnetic susceptibility (EMS) and its operation is not affected by electromagnetic waves or the like produced by other electronic device placed nearby.

In order to improve EMC, it is necessary to connect a grounding member reliably with a circuit board on which the electronic components are mounted.

SUMMARY

Embodiments of the present invention described herein provide a grounding part, an electronic device, an imaging device, and a method of producing a grounding part. The grounding part includes a first connecting component made of an electrically conductive material and connected to a circuit board having an electronic component thereon, and a second connecting component made of an electrically conductive material and connected to the first connecting component and a grounding member. The first connecting component includes a substrate connecting part connected to the circuit board, and a second-connecting-component connecting part connected to the second connecting component. The second connecting component includes a first-connecting-component connecting part connected to the first connecting component, and a grounding-part connecting part connected to the grounding member.

The electronic device includes the circuit board and the grounding member having a reference potential. The circuit board is grounded to the grounding member by the grounding part.

The imaging device includes the circuit board and the grounding member having a reference potential.

The method includes a method for producing the first connecting component and a method for producing the second connecting component. The method for producing the first connecting component includes forming a substrate connecting part connected to the circuit board, and forming a second-connecting-component connecting part connected to the second connecting component. The method for producing the second connecting component includes forming a first-connecting-component connecting part connected to the first connecting component, and forming a grounding-part connecting part connected to the grounding member.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

FIG. 23 is a perspective cross section of the electronic component module 10 of FIG. 3, according to an example embodiment of the present invention.

Figure 1:
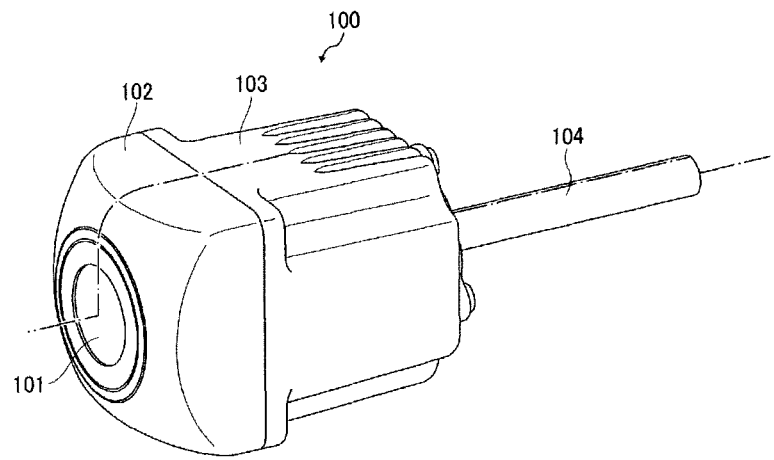
FIG. 1 is a perspective view of an imaging device that serves as an electronic device according to an example embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

A grounding part, an electronic device, an imaging device, and a method of producing a grounding part according to an example embodiment of the present invention are described with reference to the drawings.

<Electronic Device>

FIG. 1 is a perspective view of an imaging device that serves as an electronic device according to an example embodiment of the present invention. As illustrated in FIG. 1, an imaging device 100 includes a lens 101, a front case 102 that accommodates and holds the lens 101, a rear case 103 that accommodates and holds electronic component modules as will be described later, and a cable 104.

The imaging device 100 is arranged, for example, at or near a rear bumper or license plate of a vehicle, and is used as a vehicle-mounted camera to monitor the area behind the vehicle. The images captured by the imaging device 100 are transmitted to a vehicle-installed computer frame by frame, and are displayed on a liquid crystal display (LCD) installed inside the vehicle.

Note that the use of a vehicle-mounted camera is not limited to the above, and a vehicle-mounted camera may be used to monitor the area in front of a vehicle and detect an obstacle. In such case, the camera may be provided at or near the front surface of the vehicle. Moreover, an electronic device according to an example embodiment of the present invention is not limited to a vehicle-mounted camera, and may be various kinds of electronic devices such as digital cameras, camcorders, surveillance cameras, mobile phones, and smartphones.

The lens 101 forms an object image on imaging elements of the imaging device 100. The incident direction or angle of incidence of the light from an object is determined according to characteristics of the lens 101.

The front case 102 and the rear case 103 are joined to each other, and form a housing of the imaging device 100. The front case 102 and the rear case 103 are made of conductive material such as metal or conductive resin. Accordingly, each of the front case 102 and the rear case 103 serves as a grounding member having a reference potential, according to an example embodiment of the present invention.

Note that the grounding member according to an example embodiment of the present invention may be other kinds of conductive material provided for an electronic device, such as a heat sink.

The cable 104 is used to supply power to the imaging device 100, or to communicate data between the imaging device 100 and other electronic devices.

Figure 2:
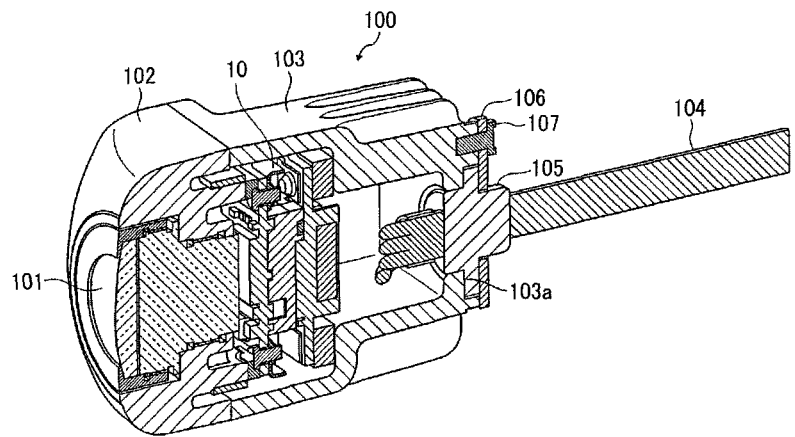
FIG. 2 is a perspective cross section of an imaging device, according to an example embodiment of the present invention.

FIG. 2 is a perspective cross section of the imaging device 100, according to an example embodiment of the present invention. As illustrated in FIG. 2, the imaging device 100 further includes a gasket 105, a cable holder 106, a screw 107, and an electronic component module 10, in addition to the configuration described above referring to FIG. 1.

The gasket 105 fills the gap between the cable 104 and an insertion hole 103a through which the cable 104 is inserted into the rear case 103, in order to hermetically seal the rear case 103.

The cable holder 106 is used to hold the cable 104 that is inserted into the rear case 103 from the rear end. Here, the cable holder 106 is fixed by fastening the screw 107 to the rear case 103 after the cable 104 is inserted into the insertion hole 103a.

The electronic component module 10 includes a circuit board on which electronic components such as imaging elements, and a grounding part according to an example embodiment of the present invention as will be described later.

<Grounding Part>

Next, a grounding part according to an example embodiment of the present invention is described, In the present example embodiment of the present invention, a grounding part is assembled to the electronic component module 10 of the imaging device 100.

Figure 3:
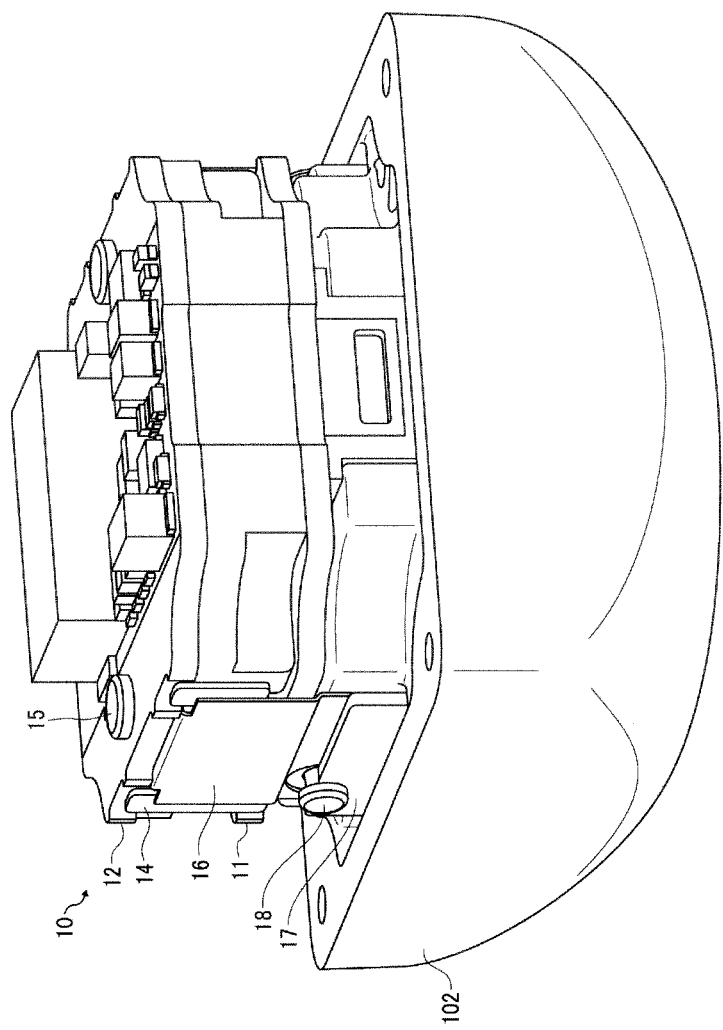
FIG. 3 is a perspective view of an electronic component module and a front case of an imaging device, according to an example embodiment of the present invention.
Figure 4:
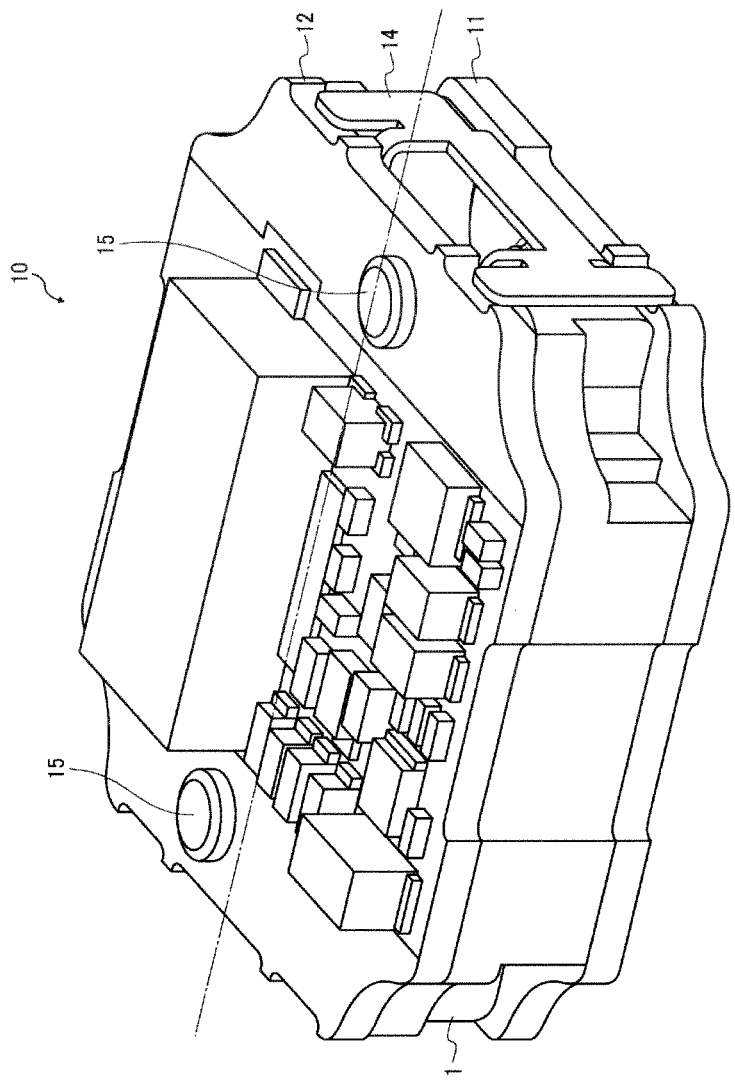
FIG. 4 is a perspective view of the electronic component module of FIG. 3 that is not yet attached to the front case, according to an example embodiment of the present invention.

FIG. 3 is a perspective view of the electronic component module 10 and the front case 102 of the imaging device 100, according to the present example embodiment of the present invention. FIG. 4 is a perspective view of the electronic component module 10 of FIG. 3 that is not yet attached to the front case 102, according to the present example embodiment of the present invention.

As illustrated in FIGS. 3 and 4, the electronic component module 10 includes a first substrate 11 and a second substrate 12 on which electronic components as will be described later are mounted. Moreover, the electronic component module 10 includes a thermal-conductive material 1 that thermally connects the first substrate 11 with the second substrate 12. The electronic component module 10 includes a first connecting component 14 that thermally connects the first substrate 11 with the second substrate 12. The electronic component module 10 includes a substrate fixing screw 15 that fixes the first substrate 11 and the second substrate 12 in place. The electronic component module 10 includes a second connecting component 16 that thermally connects the first substrate 11, the second substrate 12, and the front case 102 with each other. Further, the electronic component module 10 includes a third connecting component 17 that thermally connects the second connecting component 16 with the front case 102, and a grounding member fixing screw 18. The electronic component module 10 is installed in a space that is hermetically sealed within the front case 102 and the rear case 103.

The first connecting component 14, the second connecting component 16, and the third connecting component 17 together configure a grounding part according to an example embodiment of the present invention. Note that a grounding part according to an example embodiment of the present invention ay be configured without the third connecting component 17.

The first substrate 11 and the second substrate 12 are circuit boards on which electronic components are mounted.

The thermal-conductive material 1 is made of a material with high thermal conductivity such as thermal-conductive rubber. Note that the thermal-conductive material 1 according to the present example embodiment is made of a material with hardness lower than the hardness of a heating element. Such a material with low hardness is prone to deformation.

The first connecting component 14 is made of an electrically conductive material to electrically connect the first substrate 11 to the second substrate 12.

The substrate fixing screw 15 is made of an electrically conductive material, and fixes the first substrate 11 and the second substrate 12 to the first connecting component 14. Note that this substrate fixing screw 15 serves as a fourth connecting component according to an example embodiment of the present invention.

The second connecting component 16 is made of an electrically conductive material to electrically connect the first connecting component 14 to the front case 102.

The third connecting component 17 is made of an electrically conductive material to connect the front case 102 to the second connecting component 16 electrically.

The grounding member fixing screw 18 is made of an electrically conductive material, and fixes the second connecting component 16 and the third connecting component 17 to the front case 102.

Figure 5:
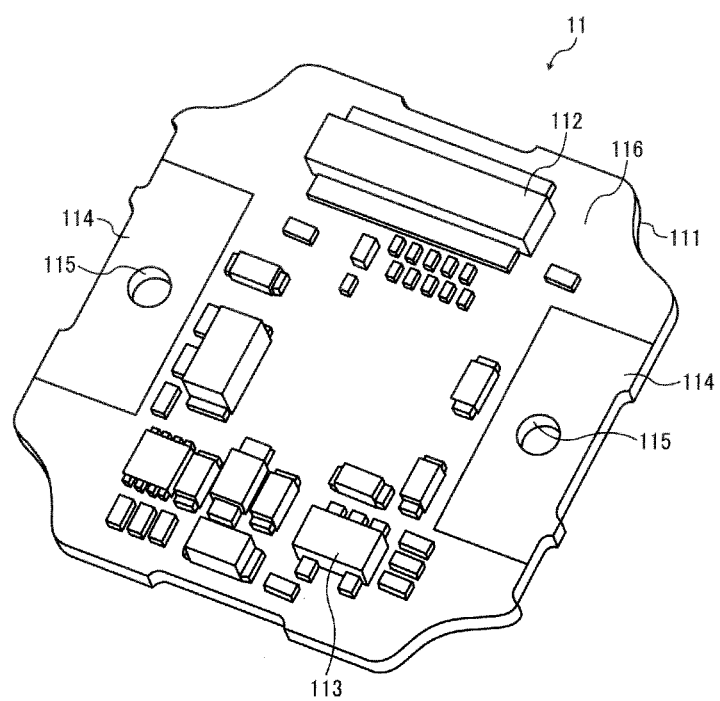
FIG. 5 is a perspective front view of a first substrate of the electronic component module of FIG. 3, according to an example embodiment of the present invention.
Figure 6:
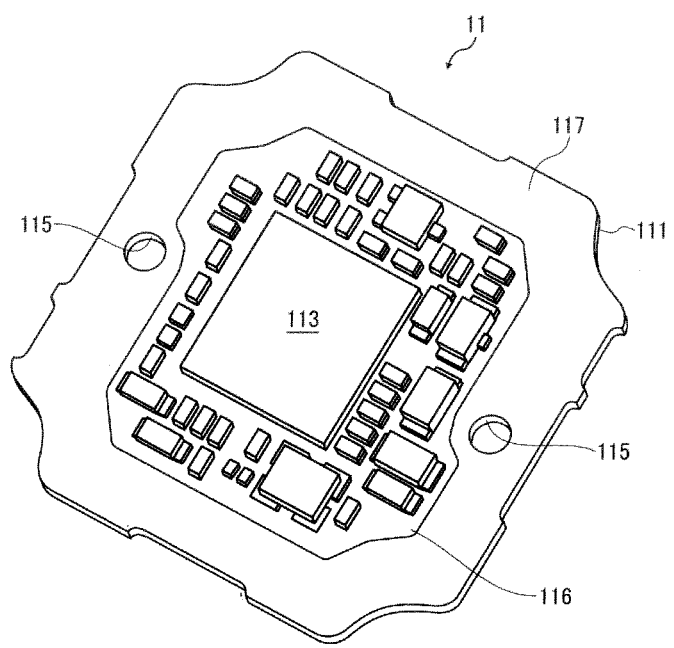
FIG. 6 is a perspective rear view of a first substrate of the electronic component module of FIG. 3, according to an example embodiment of the present invention.

FIG. 5 is a perspective front view of the first substrate 11 of the electronic component module 10 of FIG. 3, according to the present example embodiment of the present invention. FIG. 6 is a perspective rear view of the first substrate 11 of the electronic component module 10 of FIG. 3, according to the present example embodiment of the present invention. In the following description, the top side and bottom side of the first substrate 11 are referred to as the front side and back side, respectively, with reference to the electronic component module 10 of FIG. 3.

As illustrated in FIG. 5, provided on the front side of the first substrate 11 are a connector 112 and an electronic component 113 mounted on a substrate main body 111, first conductive parts 114 exposed at the portions from which a resist layer 116 is removed, and holes 115 made in the first conductive parts 114.

As illustrated in FIG. 6, provided on the back side of the first substrate 11 are the electronic component 113 mounted on the substrate main body 111, a second conductive part 117 exposed at the portions from which the resist layer 116 is removed, and the holes 115 made in the second conductive part 117.

Figure 7:
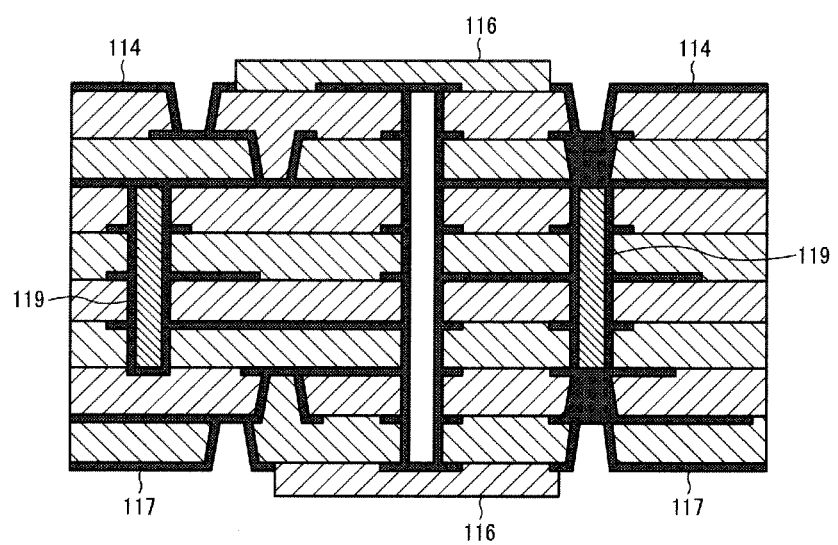
FIG. 7 is a sectional view of a substrate main body of the first substrate, according to an example embodiment of the present invention.

FIG. 7 is a sectional view of the substrate main body 111, according to the present example embodiment of the present invention. As illustrated in FIG. 7, the substrate main body 111 has the resist layers 116 on the outermost front and back sides, and the first conductive part 114 and the second conductive part 117 are exposed at the portions from which the resist layer 116 is removed by etching on the front and back sides, respectively.

The first conductive part 114 and the second conductive part 117 are made of conductive material such as a layer of copper foil. Here, the first conductive part 114 and the second conductive part 117 are electrically connected to a ground of an electronic component, and are electrically connected to each other via a through-hole 119.

Referring again to FIGS. 5 and 6, the connector 112 is electrically connected to the conductive pattern of the first substrate 11, and is connected to a connector 122 of the second substrate 12. Accordingly, the first substrate 11 is electrically connected to the second substrate 12.

The electronic component 113 implements a sensor including imaging elements that receive light reflected from a target object through the lens 101 to form an image, and an imaging element control circuit that controls the operation of the imaging elements. Here, a complementary metal oxide semiconductor (CMOS) or a charge-coupled device (CCD) is used as the imaging elements.

The holes 115 are holes into which the substrate fixing screws 15 are screwed to fix the first substrate 11 and a first connecting part of the first connecting component 14 as will be described later. Note that this substrate fixing screw 15 that is inserted (or passes) through the hole 115 is screwed into a screw hole 143 of the first connecting component 14. The head of the substrate fixing screw 15 abuts the first conductive part 114, and the threads of the substrate fixing screw 15 connect the first conductive part 114 to the second conductive part 117.

Figure 8:
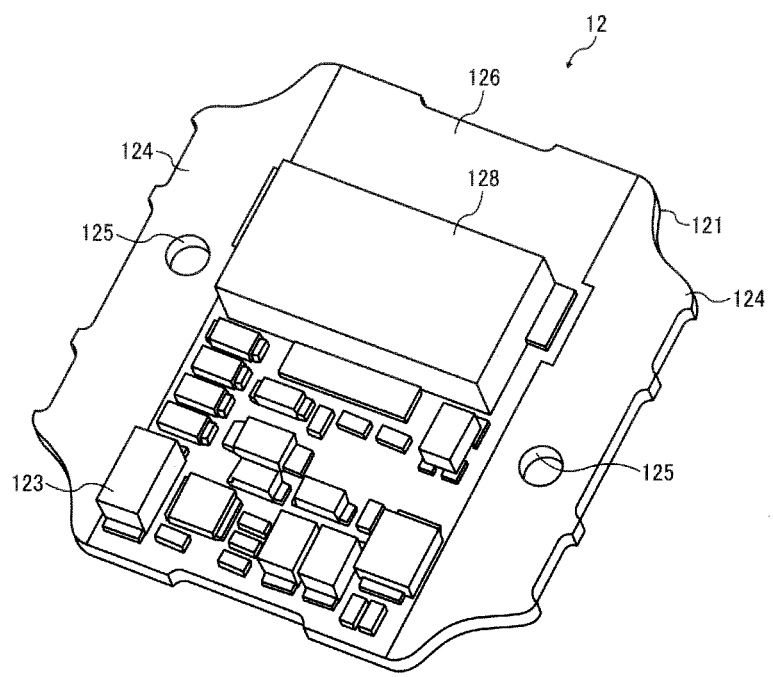
FIG. 8 is a perspective front view of a second substrate of the electronic component module of FIG. 3, according to an example embodiment of the present invention.
Figure 9:
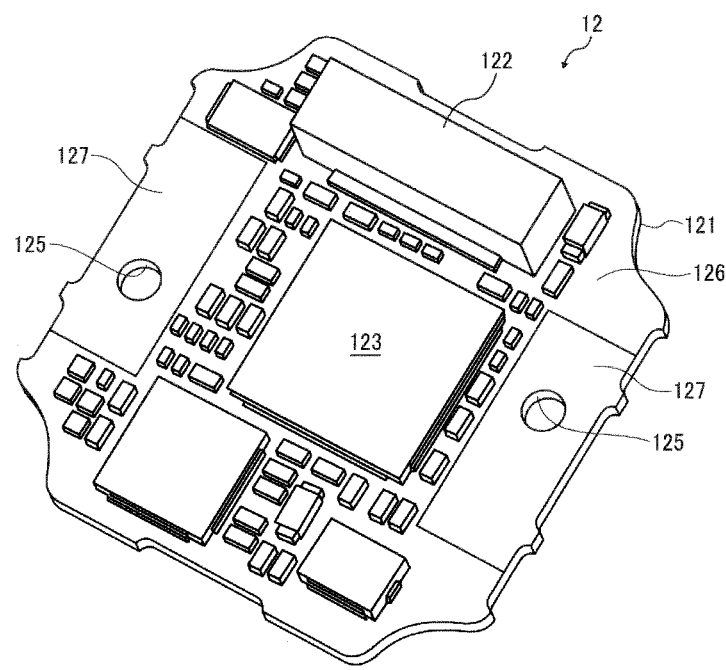
FIG. 9 is a perspective rear view of a second substrate of the electronic component module of FIG. 3, according to an example embodiment of the present invention.

FIG. 8 is a perspective front view of the second substrate 12 of the electronic component module 10 of FIG. 3, according to the present example embodiment of the present invention. FIG. 9 is a perspective rear view of the second substrate 12 of the electronic component module 10 of FIG. 3, according to the present example embodiment of the present invention. In the following description, the top side and bottom side of the second substrate 12 are referred to as the front side and back side, respectively, with reference to the electronic component module 10 of FIG. 3.

As illustrated in FIG. 8, provided on the front side of the second substrate 12 are a power connector 128 and an electronic component 123 mounted on a substrate main body 121, first conductive parts 124 exposed at the portions from which a resist layer 126 is removed, and holes 115 made in the first conductive parts 124.

As illustrated in FIG. 9, provided on the back side of the second substrate 12 are the connector 122 and the electronic component 123 mounted on the substrate main body 121, a second conductive part 127 exposed at the portions from which the resist layer 126 is removed, and the holes 125 made in the second conductive part 127.

In a similar manner to the substrate main body 111 described above, the substrate main body 121 has the resist layers 126 on the outermost front and back sides, and the first conductive part 124 and the second conductive part 127 are exposed at the portions from which the resist layer 126 is removed by etching on the front and back sides, respectively.

The connector 122 is electrically connected to the conductive pattern of the second substrate 12, and is connected to the connector 112 of the first substrate 11. Accordingly, the first substrate 11 is electrically connected to the second substrate 12.

The electronic component 123 is electrically connected to the conductive pattern of the second substrate 12, and this configures the function of a power source such as a power control circuit that controls the power supply to electronic components.

The first conductive part 124 and the second conductive part 127 are made of conductive material such as a layer of copper foil. Here, the first conductive part 124 and the second conductive part 127 are electrically connected to a ground of an electronic component, and are electrically connected to each other via a through-hole.

The holes 125 are holes into which the substrate fixing screws 15 are screwed to fix the second substrate 12 and a second connecting part of the first connecting component 14, as will be described later. Note that this substrate fixing screw 15 that is inserted (or passes) through the hole 125 is screwed into a screw hole 144 of the first connecting component 14. The head of the substrate fixing screw 15 abuts the first conductive part 124, and the threads of the substrate fixing screw 15 connect the first conductive part 124 to the second conductive part 127.

The power connector 128 is electrically connected to the conductive pattern of the second substrate 12, and is electrically connected to the first substrate 11, the second substrate 12, and a power source unit to supply power therethrough.

<First Connecting Component>

Next, the first connecting component 14 that forms a grounding part according to an embodiment of the present invention is described.

Figure 10:
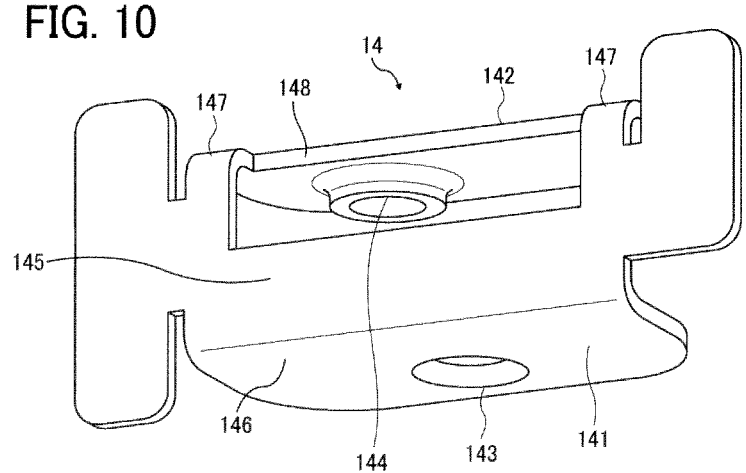
FIG. 10 is a perspective view of a first connecting component of the electronic component module of FIG. 3, according to an example embodiment of the present invention.
Figure 11:
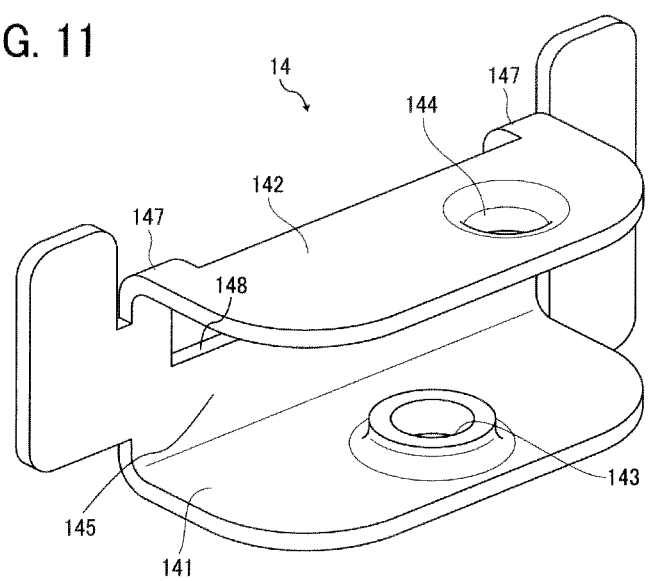
FIG. 11 is another perspective view of a first connecting component of the electronic component module of FIG. 3, according to an example embodiment of the present invention.

FIG. 10 is a perspective view of the first connecting component 14 of the electronic component module 10 of FIG. 3, according to an example embodiment of the present invention. FIG. 11 is another perspective view of the first connecting component 14 of the electronic component module 10 of FIG. 3, with an angle different from FIG. 10, according to an example embodiment of the present invention. As illustrated in FIGS. 10 and 11, the first connecting component 14 includes a flat first substrate connecting part 141 and a flat second substrate connecting part 142 parallel to the first substrate connecting part 141. The first connecting component 14 includes a leg part 145 that has a plane perpendicular to the first substrate connecting part 141 and the second substrate connecting part 142, and that is continuous with and supports the first substrate connecting part 141 and the second substrate connecting part 142. Moreover, the first connecting component 14 includes a screw hole 143 made in the first substrate connecting part 141, and a screw hole 144 made in the second substrate connecting part 142. Further, the first substrate connecting part 141 and the leg part 145 of the first connecting component 14 are bent at a first bent part 146, and the second substrate connecting part 142 and the leg part 145 of the first connecting component 14 are bent at a second bent part 147.

The first connecting component 14 is made of an electrically conductive material such as a metallic material. When a metallic plate is used to form the first connecting component 14, that metallic plate is bent to form the first connecting part 14.

The first substrate connecting part 141 and the second connecting part 142 are connected to the conductive parts of the circuit boards, i.e., the conductive parts of the first substrate 11 and the second substrate 12, respectively. In other words, the first substrate connecting part 141 and the second connecting part 142 serve as substrate connecting parts according to the present example embodiment of the present invention.

The first substrate connecting part 141 is electrically connected to the first substrate 11, and has a surface parallel to or substantially parallel to a contact surface of the first substrate 11.

Similarly, the second substrate connecting part 142 is electrically connected to the second substrate 12, and has a surface parallel to or substantially parallel to a contact surface of the second substrate 12.

The first substrate connecting part 141 and the second substrate connecting part 142 face each other with the leg part 145 therebetween. A substrate may be connected to each of the first substrate connecting part 141 and the second connecting part 142. In other words, two substrates may be connected to the first connecting component 14.

Note that the number of such substrate connecting parts in a grounding part according to an example embodiment of the present invention is not limited to two as described above, but may be one or more than two.

As described above, the first substrate 11 includes the first conductive part 114 and the second conductive part 117. In a similar manner, the second substrate 12 includes the first conductive part 124 and the second conductive part 127.

Accordingly, the first substrate connecting part 141 is connected to the first conductive part 114 and the second conductive part 117 of the first substrate 11, and is electrically connected to the electronic component 113 of the first substrate 11.

In a similar manner, the second substrate connecting part 142 is connected to the first conductive part 124 and the second conductive part 127 of the second substrate 12, and is electrically connected to the electronic component 123 of the second substrate 12.

The screw hole 143 is made through the first substrate connecting part 141, and the substrate fixing screw 15 that penetrates the first substrate 11 is screwed thereinto.

In a similar manner, the screw hole 144 is made through the second substrate connecting part 142, and the substrate fixing screw 15 that penetrates the second substrate 12 is screwed thereinto.

The leg part 145 is formed between the first substrate connecting part 141 and the second substrate connecting part 142. The first bent part 146 is formed between the first substrate connecting part 141 and the leg part 145, and the second bent part 147 is formed between the second substrate connecting part 142 and the leg part 145. When the first substrate 11 and the second substrate 12 are attached to the first connecting component 14, the leg part 145 faces edges of the first substrate 11 and the second substrate 12.

The first substrate connecting part 141 and the leg part 145 are bent at the first bent part 146.

The second substrate connecting part 142 and the leg part 145 are bent at the second bent part 147. A deformable opening 148 deformable when the second substrate 12 is connected to the second substrate connecting part 142 is formed in the second bent part 147. As the second bent part 147 has the opening 148 therein, both edges of the second bent part 147 are shaped like a hinge.

Figure 12:
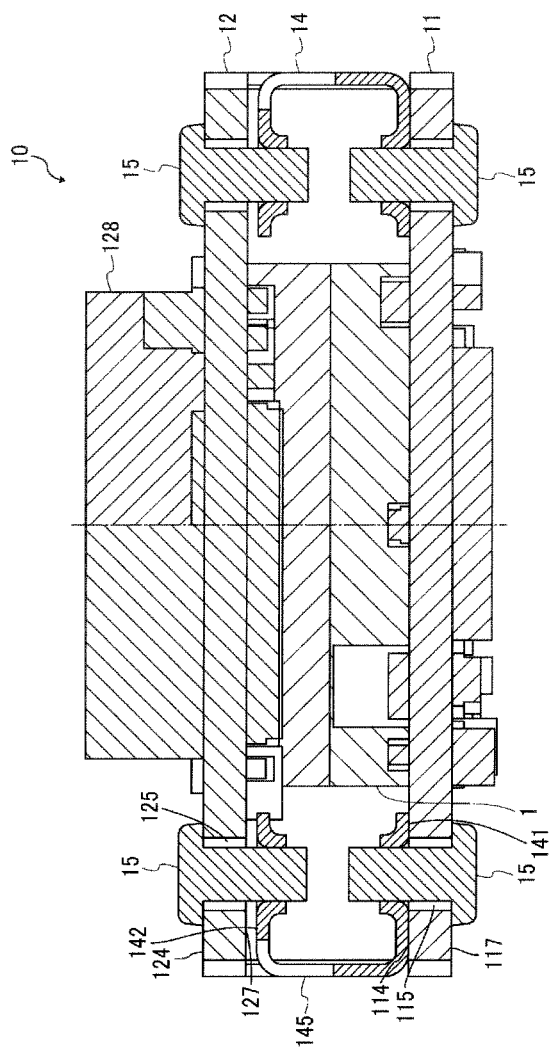
FIG. 12 is a sectional view of the electronic component module of FIG. 4, according to an example embodiment of the present invention.

FIG. 12 is a sectional view of the electronic component module of FIG. 4, according to an example embodiment of the present invention. As illustrated in FIG. 12, in the electronic component module 10, the first connecting component 14 can be electrically connected to the first substrate 11 and the second substrate 12 by fixing the first connecting component 14 to the first substrate 11 and the second substrate 12 by the substrate fixing screw 15.

In other words, the first substrate connecting part 141 of the first connecting component 14 is electrically connected to the first conductive part 114 of the first substrate 11, and is electrically connected to the second conductive part 117 of the first substrate 11 via the substrate fixing screw 15.

In a similar manner, the second substrate connecting part 142 of the first connecting component 14 is electrically connected to the second conductive part 127 of the second substrate 12, and is electrically connected to the first conductive part 124 of the second substrate 12 via the substrate fixing screw 15.

Figure 13:
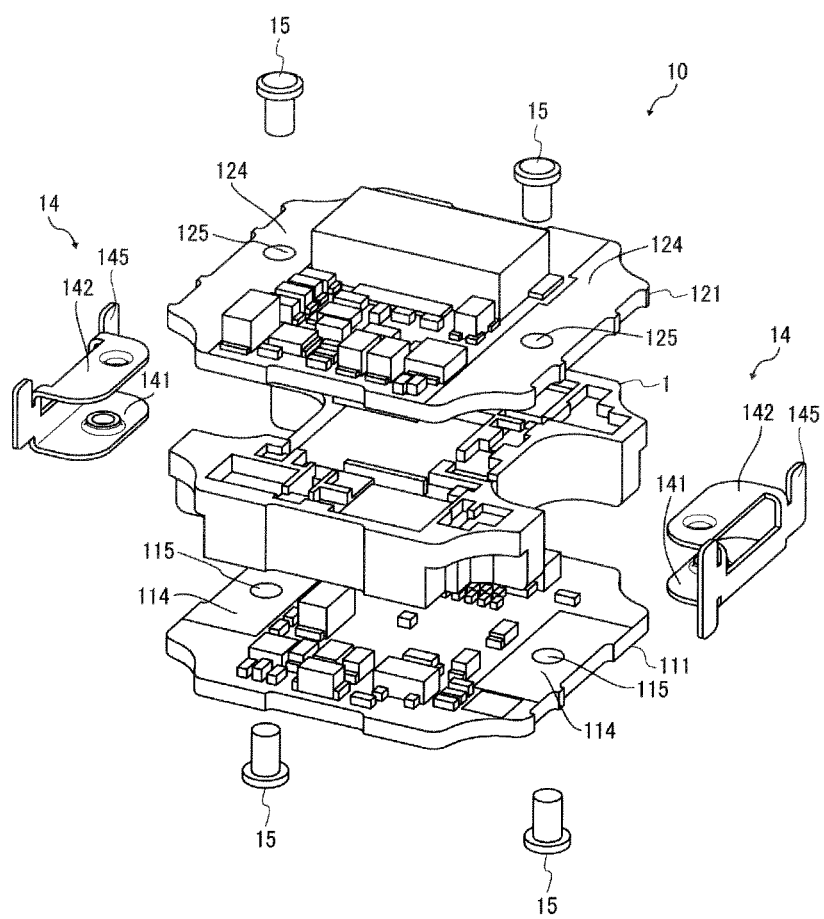
FIG. 13 is an exploded perspective view of the electronic component module of FIG. 3, according to an example embodiment of the present invention.

FIG. 13 is an exploded perspective view of the electronic component module 10 of FIG. 3, according to an example embodiment of the present invention. As illustrated in FIG. 13, when the electronic component module 10 is assembled, the first connecting component 14 is arranged between the first substrate 11 and the second substrate 12, and the first connecting component 14 is fixed to the first substrate 11 and the second substrate 12 by the substrate fixing screw 15. Note that the electronic component module 10 according to the present example embodiment includes a plurality of first connecting components 14 (i.e., two first connecting components 14 in the present example embodiment), and these first connecting components 14 support a plurality of sides of the first substrate 11 and the second substrate 12.

As the first substrate 11 and the second substrate 12 are fixed to the first connecting components 14, the connector 112 of the first substrate 11 and the connector 122 of the second substrate 12 are electrically connected to each other.

Figure 14:
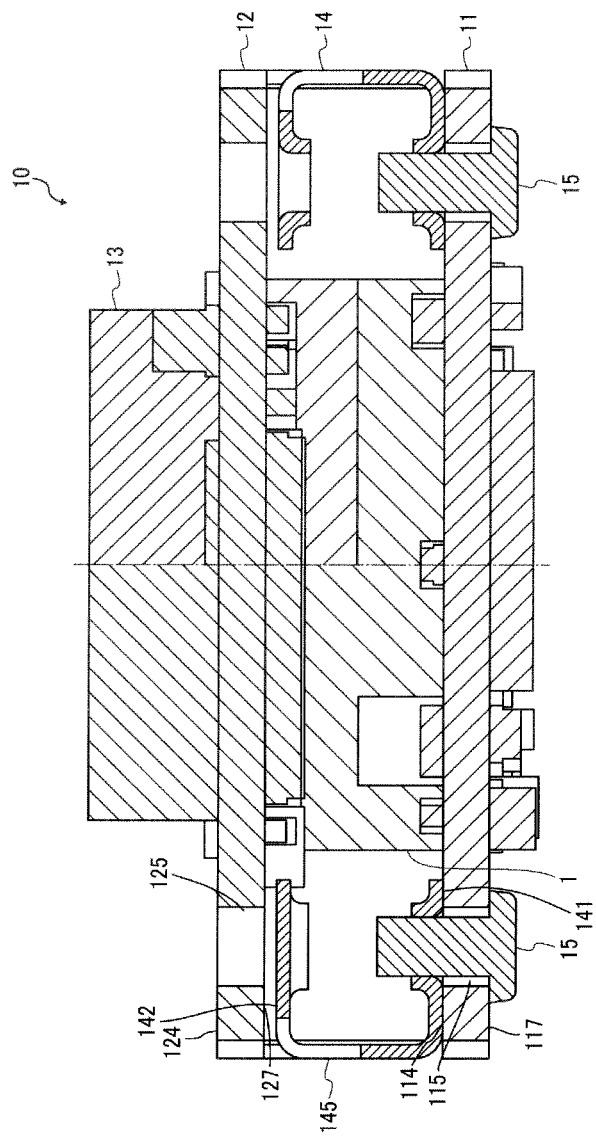
FIG. 14 is a cross section of the electronic component module of FIG. 3 to which a second substrate is attached, according to an example embodiment of the present invention.
Figure 15:
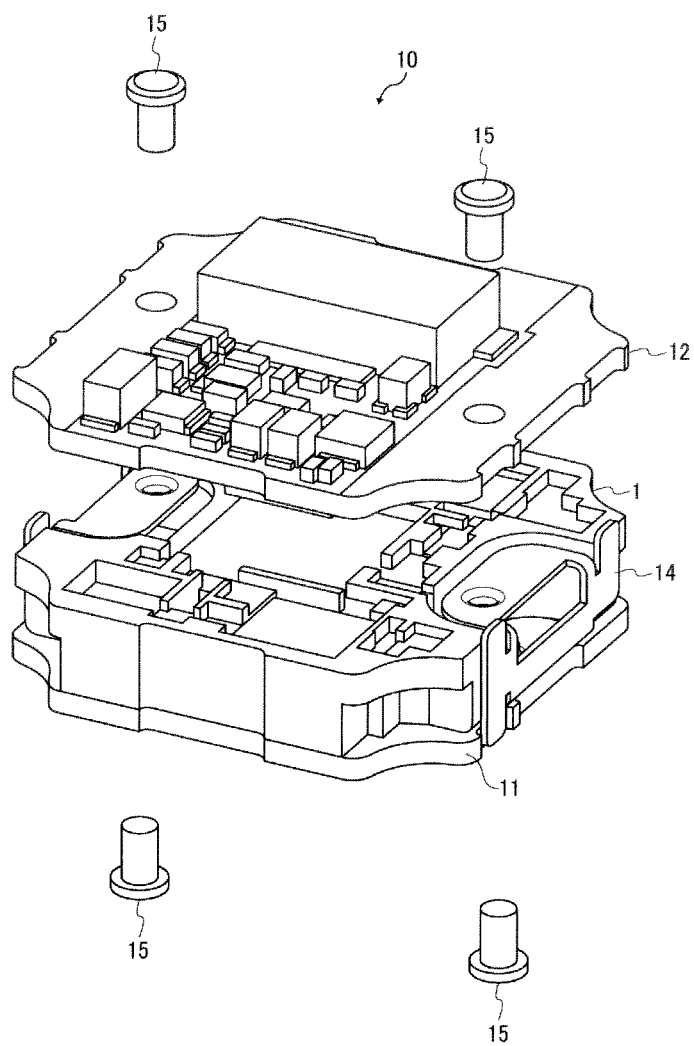
FIG. 15 is a perspective view of the electronic component module of FIG. 3 to which a second substrate is attached, according to an example embodiment of the present invention.

FIG. 14 is a cross section of the electronic component module 10 of FIG. 3 to which the second substrate 12 is attached, according to an example embodiment of the present invention. FIG. 15 is a perspective view of the electronic component module 10 of FIG. 3 to which the second substrate 12 is attached, according to an example embodiment of the present invention. As illustrated in FIGS. 14 and 15, it is desired in the electronic component module 10 that the second substrate 12 be fixed to the second connecting part 142 that has the second bent part 147.

Note that the second substrate connecting part 142 is fixed to the second substrate 12 because the electronic component 113 mounted on the first substrate 11 includes an imaging element or the like on which a load such as stress cannot be applied. The stress is absorbed at the second bent part 147 as the second substrate the second substrate connecting part 142 is fixed to the second substrate 12. Accordingly, a load is prevented from being applied to an imaging element or the like via the first substrate 11.

Figure 16:
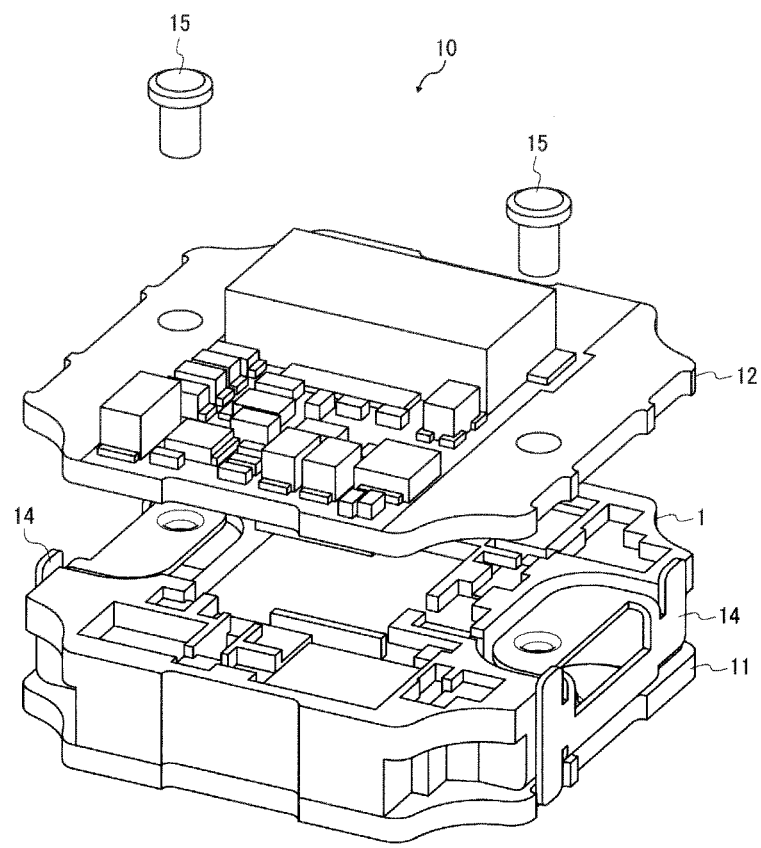
FIG. 16 is a perspective view of the electronic component module of FIG. 3 to which a first substrate is attached, according to an example embodiment of the present invention.

FIG. 16 is a perspective view of the electronic component module 10 of FIG. 3 to which the first substrate 11 is attached, according to an example embodiment of the present invention. As illustrated in FIG. 16, the thickness of the thermal-conductive material 1 is greater than the space between the second substrate connecting part 142 and the first substrate connecting part 141. For this reason, the thermal-conductive material 1 needs to be elastically deformed and the second substrate 12 needs to be fixed to the first connecting component 14 by the substrate fixing screw 15, in order to electrically connect the second substrate 12 to the second substrate connecting part 142.

As the second substrate 12 is fixed to the first connecting component 14 by the substrate fixing screw 15, the second bent part 147 is plastically deformed. Accordingly, the second substrate connecting part 142 is securely connected to the second conductive part 127.

As the second substrate 12 is fixed to the first connecting component 14 by the substrate fixing screw 15, connectors of the first substrate 11 and the second substrate 12 are connected to each other.

Due to the first connecting component 14 that has the second bent part 147, the first substrate 11 and the second substrate 12 can be securely and electrically connected to each other without exerting a load on the first substrate 11 and the second substrate 12.

Note that the number of the circuit boards connected to the first connecting component 14 is not limited to two, i.e., the first substrate 11 and the second substrate 12 as described above, but may be one or more than two.

<Second Connecting Component>

Next, the second connecting component 16 is described.

Figure 17:
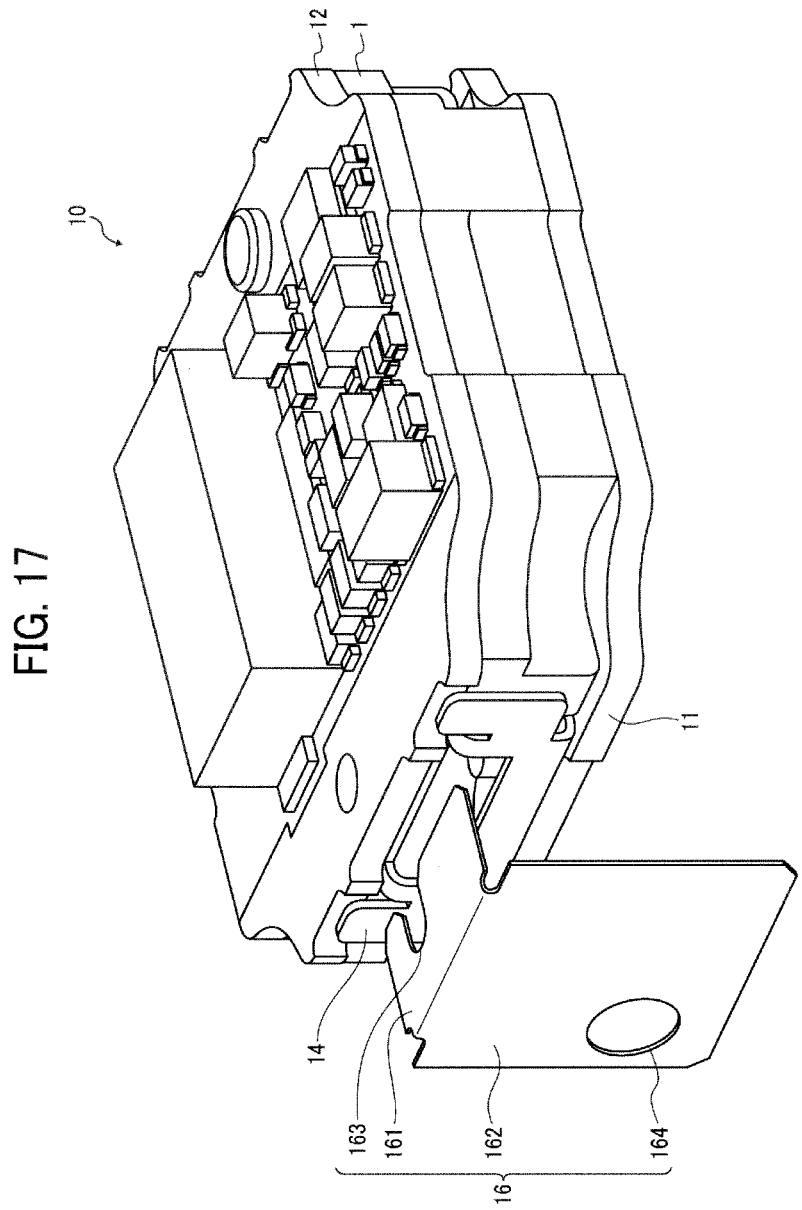
FIG. 17 is a perspective view of the electronic component module of FIG. 3 to which a second connecting component is about to be attached, according to an example embodiment of the present invention.

FIG. 17 is a perspective view of the electronic component module 10 of FIG. 3 to which the second connecting component 16 is about to be attached, according to an example embodiment of the present invention. As described above, the second connecting component 16 is made of an electrically conductive material to connect the first connecting component 14 to the front case 102 electrically. As illustrated in FIG. 17, the second connecting component 16 includes a flat first connecting part 161, a flat second connecting part 162 perpendicular to and continuous with the first connecting part 161, a notch 163 formed in a side of the first connecting part 161, and a through-hole 164 formed through the second connecting part 162.

The first connecting part 161 is connected to the first connecting component 14. The first connecting part 161 serves as a first-connecting-component connecting part according to an example embodiment of the present invention. The first connecting part 161 is disposed between the second substrate 12 and the thermal-conductive material 1.

The second connecting part 162 is connected to the front case 102. The second connecting part 162 is electrically connected to the first connecting part 161. The second connecting part 162 serves as a grounding-part connecting part according to an example embodiment of the present invention.

The notch 163 is formed in a side of the first connecting part 161. The notch 163 is shaped to accommodate the substrate fixing screw 15 when the first connecting part 161 is disposed between the second substrate 12 and the thermal-conductive material 1.

The hole 164 is formed through the second connecting part 162. The hole 164 is formed such that the grounding member fixing screw 18 can go through the second connecting part 162 when the second connecting part 162 is fixed to the front case 102.

Figure 18:
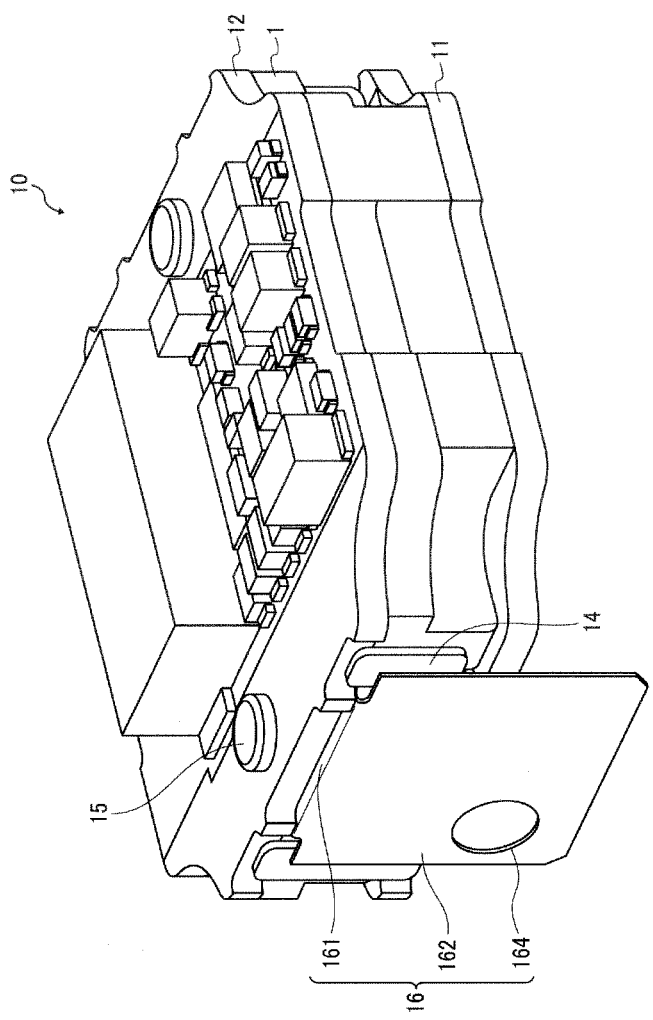
FIG. 18 is a perspective view of the electronic component module of FIG. 3 to which a second connecting component is attached, according to an example embodiment of the present invention.

FIG. 18 is a perspective view of the electronic component module 10 of FIG. 3 to which the second connecting component 16 is attached, according to an example embodiment of the present invention.

As illustrated in FIGS. 17 and 18, a part of the second connecting component 16 is sandwiched between the second substrate 12 and the first connecting part 14, and another part of the second connecting component 16 is fixed to the front case 102, which is an example of a grounding member. Accordingly, the second connecting component 16 can electrically connect the first substrate 11 and the second substrate 12 to the front case 102 via the first connecting component 14.

The second connecting part 16 is made of a thermal-conductive material that is deformable to fit the shape of the second substrate connecting part 142 of the first connecting component 14 or the shape of the second conductive part 127 of the second substrate 12. More specifically, the second connecting part 16 is made of a thermal-conductive material that is more flexible than the first connecting component 14 or the second substrate 12. For example, the second connecting component 16 is made of a sheet of copper foil.

When the second connecting part 16 is deformable, the shape of the second connecting component 16 deforms to fit the shape of a contact portion, i.e., the shape of the second substrate connecting part 142 or the second conductive part 127.

The second connecting part 162 is electrically connected to the first substrate connecting part 141 or the leg part 145. In other words, the second connecting part 162 serves as a grounding-part connecting part according to an example embodiment of the present invention, and the first substrate connecting part 141 or the leg part 145 serves as a second connecting-component connecting part according to an example embodiment of the present invention.

Figure 19:
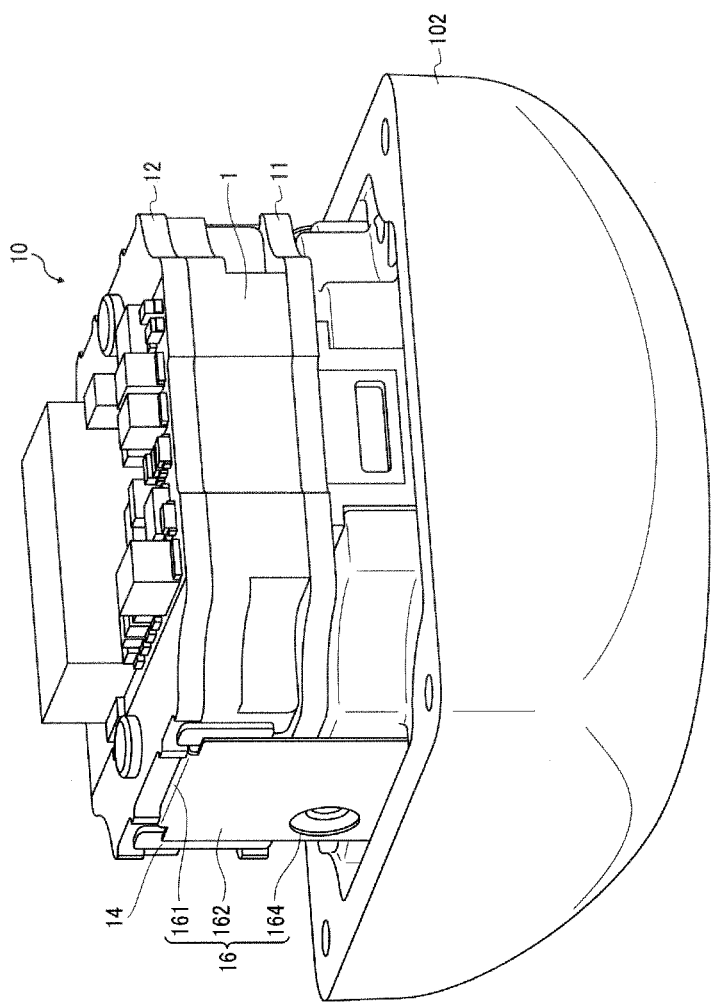
FIG. 19 is a perspective view of the electronic component module of FIG. 3 to which a second connecting component is about to be attached and a front case of the imaging device, according to an example embodiment of the present invention.

FIG. 19 is a perspective view of the electronic component module 10 of FIG. 3 to which the second connecting component 16 is about to be attached and the front case 102 of the imaging device 100, according to an example embodiment of the present invention.

The imaging device 100 electrically connects the second connecting component 16, which is electrically connected to the first connecting component 14, to the front case 102. In other words, the imaging device 100 achieves the grounding of the electronic component 113 and the electronic component 123, which are mounted on the first substrate and the second substrate 12, respectively, by the first connecting component 14 and the second connecting component 16.

Figure 20:
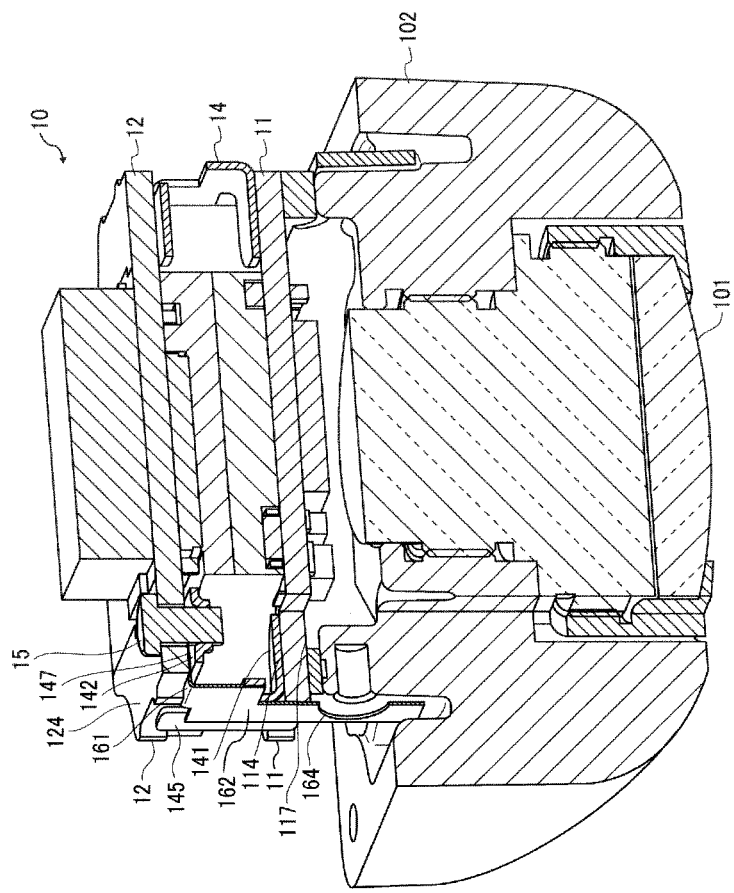
FIG. 20 is a perspective cross section of the electronic component module and the front case of an imaging device illustrated in FIG. 19, according to an example embodiment of the present invention.

FIG. 20 is a perspective cross section of the electronic component module 10 and the front case 102 of the imaging device 100 illustrated in FIG. 19, according to an example embodiment of the present invention. In FIG. 20, the grounding member fixing screw 18 is not yet fixed through the hole 164. The second connecting part 162 can be more securely grounded by fixing the second connecting part 162 to the front case 102 by the grounding member fixing screw 18.

<Third Connecting Component>

Next, the third connecting component 17 is described.

The third connecting component 17 increases the degree of the electrical contact between the second connecting component 16 and the front case 102. As described above, the third connecting component 17 is made of an electrically conductive material to connect the second connecting component 16 to the front case 102 electrically.

Figure 21:
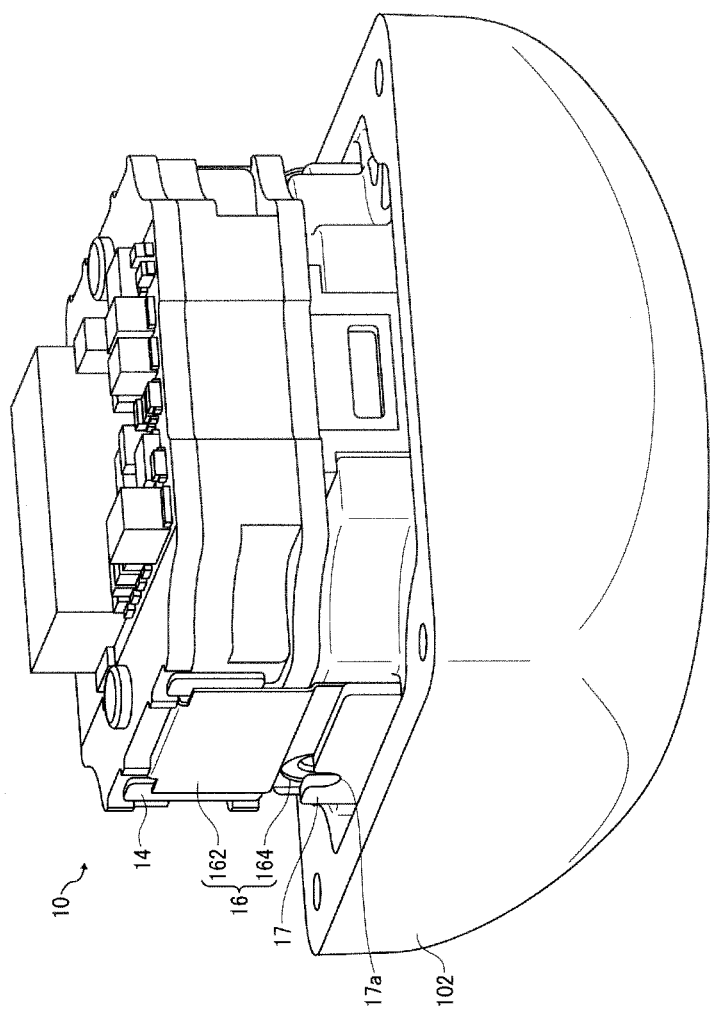
FIG. 21 is a perspective view of the electronic component module of FIG. 3 to which a third connecting component has been attached and a front case of the imaging device, according to an example embodiment of the present invention.
Figure 22:
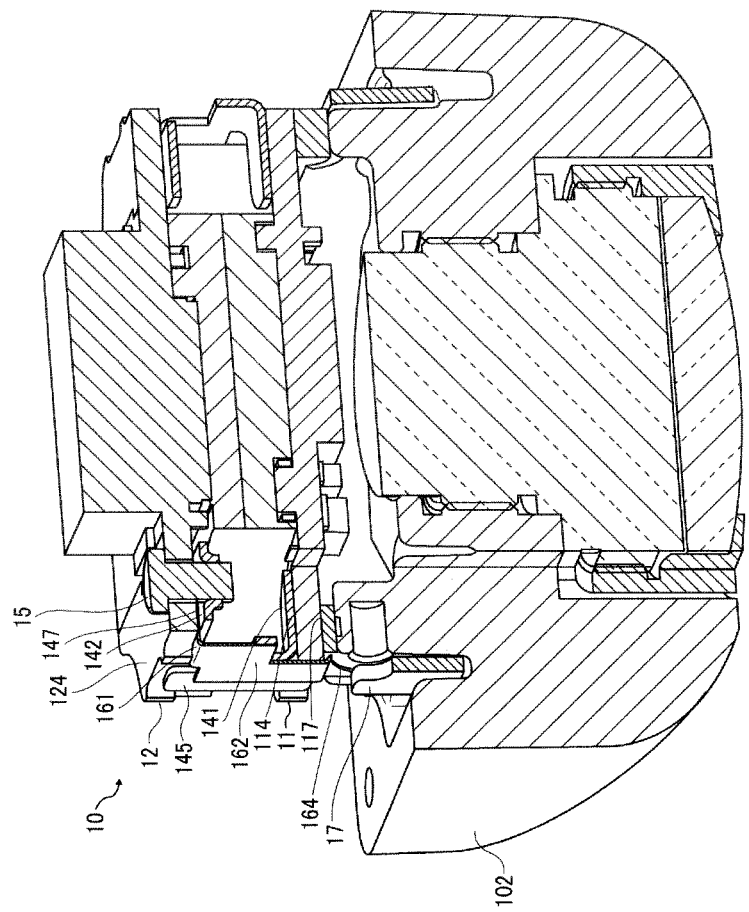
FIG. 22 is a perspective cross section of the electronic component module and the front case of an imaging device illustrated in FIG. 21, according to an example embodiment of the present invention.

FIG. 21 is a perspective view of the electronic component module 10 of FIGS. 3 to which the third connecting component 17 has been attached and the front case 102 of the imaging device 100, according to an example embodiment of the present invention. FIG. 22 is a perspective cross section of the electronic component module 10 and the front case 102 of the imaging device 100 illustrated in FIG. 21, according to an example embodiment of the present invention.

As illustrated in FIGS. 21 and 22, the third connecting component 17 is disposed so as to cover the second connecting part 162, in order to fix the second connecting component 16 to the front case 102.

The third connecting component 17 is a plate-like member that distributes the force caused by the grounding member fixing screw 18 over the second connecting part 162. The third connecting component 17 can more reliably connect the second connecting component 16 to the front case 102 electrically.

The third connecting component 17 has a notch 17a in one side that is formed to fit the shape of the hole 164, and the degree of electrical contact can be increased by contacting the head of the grounding member fixing screw 18 against the edges of the notch 17a.

FIG. 23 is a perspective cross section of the electronic component module 10 of FIG. 3, according to an example embodiment of the present invention. As illustrated in FIG. 23, in a grounding part according to an example embodiment of the present invention that includes the first connecting component 14 and the second connecting component 16, the first connecting component 14 is electrically connected to the second connecting component 16, and the first substrate 11 and the second substrate 12. Moreover, in a grounding part according to an example embodiment of the present invention, the second connecting component 16 is electrically connected to the front case 102.

As described above, a grounding part according to an example embodiment of the present invention can achieve high EMC with the first connecting component 14 and the second connecting component 16.

With the grounding part according to an example embodiment of the present invention, the third connecting component 17 touches the second connecting component 16 to increase the degree of electrical contact between the second connecting component 16 and the front case. Accordingly, EMC is improved.

With the grounding part according to an example embodiment of the present invention, the first conductive part 114 formed on the back side of the first substrate 11 and the second conductive part 127 formed on the back side of the second substrate 12 are grounded. Accordingly, the downsizing is achieved and EMC is also improved.

With the grounding part according to an example embodiment of the present invention, the downsizing is achieved and EMC is also improved by the leg part 145, the first bent part 146, and the second bent part 147.

With the grounding part according to an example embodiment of the present invention, a deformable opening is formed on the second bent part 147 to cause deformation. Accordingly, the second bent part 147 is plastically deformed, and the second substrate connecting part 142 is securely connected to the second conductive part 127.

With the grounding part according to an example embodiment of the present invention, the first substrate connecting part 141 and the second substrate connecting part 142 of the first connecting component 14 face each other having the leg part 145 therebetween. Accordingly, the downsizing is achieved and EMC is also improved.

With the grounding part according to an example embodiment of the present invention, EMC can be improved by the substrate fixing screw 15 made of an electrically conductive material that electrically connects the first substrate 11 and the second substrate 12 to the first connecting component 14.

With the grounding part according to an example embodiment of the present invention, the second connecting component 16 is made of a deformable material such as a sheet of copper foil. Accordingly, the grounding part according to an example embodiment of the present invention can be grounded to a grounding member with a wide area.

<Method of Producing Grounding Part>

Next, a method of producing grounding parts according to an example embodiment of the present invention is described.

As described above, the first connecting component 14 and the second connecting component 16 illustrated in FIGS. 3 and 4 together configure a grounding part according to an example embodiment of the present invention.

In order to produce the first connecting part 14 (FIGS. 10, 11), firstly, a plate-like material made of metal such as copper and aluminum is punched by performing a pressing process or the like, and the planar shape of the first connecting component 14 including the first substrate connecting part 141, the second substrate connecting part 142, and the leg part 145 is formed.

In order to produce the first connecting part 14, secondly, the boundaries of the plate-like material formed to have the planar shape of the first connecting component 14 are bent to form the first bent part 146 and the second bent part 147, where the boundaries divide the first connecting component 14 into three parts including the first substrate connecting part 141, the second substrate connecting part 142, and the leg part 145.

In order to produce the second connecting part 16 (FIG. 17), a plate-like material made of metal such as copper and aluminum is punched by performing a pressing process or the like, and the second connecting part 162 and the first connecting part 161 that is to be connected to the first connecting component 14 are formed.

By the processes as described above, it becomes possible to produce the first connecting component 14 and the second connecting component 16.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A grounding part comprising:
   a first connecting component made of an electrically conductive material and connected to a circuit board having an electronic component thereon; and
   a second connecting component made of an electrically conductive material and connected to the first connecting component and a grounding member,
   wherein
   the first connecting component includes
      a substrate connecting part connected to the circuit board, and
      a second-connecting-component connecting part connected to the second connecting component, and
   the second connecting component includes
      a first-connecting-component connecting part connected to the first connecting component, and
      a grounding-part connecting part connected to the grounding member.

2. The grounding part according to claim 1, further comprising a third connecting component connected to the grounding member and the second connecting component.

3. The grounding part according to claim 1, wherein the substrate connecting part is connected to a conductive part formed on a back side of the circuit board.

4. The grounding part according to claim 1, wherein the first connecting component comprises:
   a leg part connected to the substrate connecting part; and
   a bent part formed between and continuous with a first substrate connecting part and the leg part.

5. The grounding part according to claim 4, wherein the bent part includes a deformable opening.

6. The grounding part according to claim 4, wherein the first connecting component includes a plurality of first connecting components at positions facing the substrate connecting part having the leg part therebetween.

7. The grounding part according to claim 1, further comprising a fourth connecting component made of an electrically conductive material and connected to the first connecting component and the circuit board.

8. The grounding part according to claim 1, wherein the second connecting component is made of a deformable material.

9. The grounding part according to claim 8, wherein the second connecting component is made of a sheet of copper foil.

10. An electronic device comprising:
    a circuit board having an electronic component thereon; and
    a grounding member having a reference potential,
    wherein the circuit board is grounded to the grounding member by the grounding part according to claim 1.

11. An imaging device comprising:
    a circuit board having an electronic component thereon; and
    a grounding member having a reference potential,
    wherein
    the circuit board is grounded to the grounding member by a grounding part,
    the grounding part includes
       a first connecting component made of an electrically conductive material and connected to a circuit board having an electronic component thereon; and
       a second connecting component made of an electrically conductive material and connected to the first connecting component and a grounding member, the first connecting component includes
- a substrate connecting part connected to the circuit board, and
- a second-connecting-component connecting part connected to the second connecting component, and the second connecting component includes
- a first-connecting-component connecting part connected to the first connecting component, and
- a grounding-part connecting part connected to the grounding member.

12. The imaging device according to claim 11, wherein the grounding part includes a third connecting component connected to the grounding member and the second connecting component.

13. The imaging device according to claim 11, wherein the substrate connecting part is connected to the conductive part formed on a back side of the circuit board.

14. The imaging device according to claim 11, wherein the first connecting component comprises:
- a leg part connected to the substrate connecting part; and
- a bent part formed between and continuous with a first substrate connecting part and the leg part.

15. The imaging device according to claim 14, wherein the bent part includes a deformable opening.

16. The imaging device according to claim 14, wherein the first connecting part includes a plurality of first connecting components at positions facing the substrate connecting part having the leg part therebetween.

17. The imaging device according to claim 11, wherein the grounding part includes a fourth connecting component made of an electrically conductive material and connected to the first connecting component and the circuit board.

18. The imaging device according to claim 11, wherein the second connecting component is made of a deformable material.

19. The imaging device according to claim 18, wherein the second connecting component is made of a sheet of copper foil.

20. A method of producing a grounding part, the grounding part including a first connecting component made of an electrically conductive material and connected to a circuit board having an electronic component thereon, and a second connecting component made of an electrically conductive material and connected to the first connecting component and a grounding member, the method comprising:
- forming a substrate connecting part connected to the circuit board;
- forming a second-connecting-component connecting part connected to the second connecting component;
- forming a first-connecting-component connecting part connected to the first connecting component; and
- forming a grounding-part connecting part connected to the grounding member.

* * * * *